United States Patent [19]

Chantepie

[11] Patent Number: 4,661,725
[45] Date of Patent: Apr. 28, 1987

[54] ELEMENTARY LOGIC CIRCUIT OBTAINED BY MEANS OF FIELD EFFECT TRANSISTORS OF GALLIUM ARSENIDE AND COMPATIBLE WITH THE ECL 100 K TECHNOLOGY

[75] Inventor: Bernard Chantepie, Lozere, France

[73] Assignee: U.S. Philips Corporation, New York, N.Y.

[21] Appl. No.: 699,108

[22] Filed: Feb. 7, 1985

[30] Foreign Application Priority Data

Feb. 8, 1984 [FR] France ................................ 84 01932

[51] Int. Cl.$^4$ .................... H03K 19/003; H03K 19/01; H03K 19/094; H03K 3/356
[52] U.S. Cl. ..................................... 307/450; 307/279; 307/443; 307/359; 307/571
[58] Field of Search ............... 307/450, 455, 475, 443, 307/279, 571, 584, 575, 577, 304, 448, 359

[56] References Cited

U.S. PATENT DOCUMENTS

| | | | |
|---|---|---|---|
| 4,185,211 | 1/1980 | Kucharewski | 307/359 X |
| 4,438,351 | 3/1984 | Schuermeyer | 307/450 |
| 4,488,064 | 12/1984 | Vance | 307/443 X |
| 4,518,871 | 5/1985 | Toyoda et al. | 307/450 X |

OTHER PUBLICATIONS

Katsu et al., "A GaAs Monolithic Frequency Divider Using Source Coupled FET Logic", IEEE Electron Device Letters, vol. EDL-3, No. 8, pp. 197-199, Aug. 1982.
Evans, "Designing With Field-Effect Transistors", Siliconix Inc., McGraw-Hill Book Co., pp. 245-248, 1981.
Van Tuyl et al., "High Speed Integrated Logic with GaAs MESFETS", IEEE Journal of Solid State Circuits, vol. SC-9, No. 5, pp. 269-276, Oct. 1974.
Lehovec et al., "Analysis of GaAs FET's for Integrated Logic", IEEE Transactions on Electron Devices, vol. ED-27, No. 6, pp. 1074-1091, Jun. 1980.

Primary Examiner—Stanley D. Miller
Assistant Examiner—David R. Bertelson
Attorney, Agent, or Firm—Robert T. Mayer; Steven R. Biren

[57] ABSTRACT

An elementary logic circuit obtained by means of Schottky barrier field effect transistors of gallium arsenide includes a differential amplifier, whose first branch, controlled by the input signal E, supplies an output signal $S_1$, and whose second branch, controlled by a reference signal, supplies an output signal $S_2$. This circuit further includes two paired level translator stages, the first of which supplies output signal S and the second of which supplies a complementary signal $\overline{S}$, the output signal S constituting the reference signal which controls the second branch of the differential amplifier. The circuit can advantageously be used in high-speed IC modules having a lower power consumption, consisting of gallium arsenide and compatible with the circuits realized according to the ECL 100 K technology on silicon.

2 Claims, 3 Drawing Figures

ELEMENTARY LOGIC CIRCUIT OBTAINED BY MEANS OF FIELD EFFECT TRANSISTORS OF GALLIUM ARSENIDE AND COMPATIBLE WITH THE ECL 100 K TECHNOLOGY

BACKGROUND OF THE INVENTION

The invention relates to an elementary logic circuit obtained by means of field effect transistors of gallium arsenide and is used in the manufacture of modules of high-speed integrated circuits having a low power consumption, consisting of gallium arsenide and compatible with the high-speed integrated circuits formed as logic circuits by the ECL 100 K technology on silicon.

The ECL 100 K technology (ECL is short for Emitter-Coupled-Logic) utilizing bipolar transistors permits obtaining high-speed integrated circuits. However, such circuits consume much energy. Therefore, attempts are being made to replace in certain cases the ECL 100 K technology by another technology, by which integrated circuits can be obtained, which operate at the same speed, but which consume much less energy.

However, one kind of logic circuits can be replaced only gradually by another kind of logic circuits. Consequently, it is necessary to replace in a first period a certain number of modules obtained according to the ECL 100 K technology by equivalent modules obtained according to the novel technology selected to this end. The two technologies thus have to coexist and it is absolutely necessary that they are made compatible. In these conditions, they must have:

the same supply voltage or voltages;
the same control voltage level of the logic gates and the same form of transfer function of the logic gates.

When replacing a whole IC module obtained according to the ECL 100 K technology, this therefore first results in considering the possibility of replacing an elementary ECL 100 K gate by an equivalent gate obtained according to the novel technology.

An elementary gate according to the ECL technology is known, for example, from French Patent Specification Publication No. 2407612, published on May 25, 1979, in which such a gate is shown as a part of FIG. 1 and is in the form of a logic <<OR/NOR>> gate. It should be noted that in fact a <<NOR>> gate having a single input, rather having an inverter function, but capable of giving off two complementary signals is concerned. This gate is first constituted by a differential amplifier formed by two planar npn transistors $T_1$ and $T_2$ whose emitters are coupled and whose output is connected through a resistor $R_1$ or $R_2$ to a reference potential $V_{CC}$. The base of the transistor $T_1$ receives the input signal $T_1$, while the base of the transistor $T_2$ is connected to a reference potential $V_{BB}$, which is an internal reference. In order to ensure that this differential stage is supplied with current, a transistor $S_1$ is utilized, whose base is brought to a potential $V_B$ and whose emitter is connected through a resistor $R_1$ to a third potential $V_{EE}$.

The output of the differential stage constituted by the collector of the transistor $T_2$ is connected to the base of another bipolar transistor $T_3$, while the output constituted by the collector of the transistor $T_1$ is connected to the base of another bipolar transistor $T_4$. The collectors of the two transistors $T_3$, $T_4$ are applied to the supply potential $V_{CC}$, while their emitters are supplied with current by a respective transistor $S$, which is connected in the same manner as the transistor $S_1$. The output of the real signal is formed at the emitter of the transistor $T_3$, while the output signal of its complementary transistor is formed at the emitter of the transistor $T_4$.

The performance obtained by means of such a logic circuit is for each elementary gate a power consumption of the order of 20 mW, a propagation time of the order of 400 ps, a maximum operating frequency of the order of 1 GHz. The integration density can reach 1200 to 2000 gates per $cm^2$.

The literature with respect to the consideration of novel high-speed low-consumption technologies has shown that the Schottky barrier field effect transistor of gallium arsenide constitutes a high-speed switching component, which can be monolithically integrated with resistors and Schottky diodes to form high-speed logic circuits or high-frequency circuits. This performance is due to the properties of gallium arsenide, which has a high electron mobility and a high saturation rate.

The invention relates to an elementary logic circuit obtained by means of Schottky barrier field effect transistors of gallium arsenide comprising a differential amplifier, whose first branch is constituted by the transistor $T_1$ of the enhancement type controlled by the input signal E and connected through its drain, at which the output signal $S_1$ is available, to a first supply voltage terminal ($V_{DD}$) via the load resistor $R_1$, whose second branch is constituted by the transistor $T_2$ of the enhancement type controlled by a reference signal and connected through its drain, at which the output signal $S_2$ is available, to the first supply voltage terminal ($V_{DD}$) via the load resistor $R_2$, the coupled sources of the transistors $T_1$ and $T_2$ being supplied with current by a transistor $T_5$ of the charge depletion type connected in common shortcircuited gate/source arrangement to a second supply voltage terminal ($V_{SS}$), while this circuit comprises secondly two paired stages designated as level translators, the first of which is constituted by a transistor $T_4$ connected in common drain arrangement to the first supply voltage terminal ($V_{DD}$) controlled by the output signal $S_1$ of the first branch of the differential amplifier and connected by its source to the anode of a diode $D_4$, and the second of which is constituted by a transistor $T_3$ connected in common drain arrangement to the potential $V_{DD}$, controlled by the output signal $S_2$ of the second branch of the differential amplifier and connected by its source to the anode of a diode $D_3$.

Such a logic gate is known from the prior art by the article of Katsuhiko Suyama et al, of Fujitsu Ltd., entitled "A GaAs high-speed counter using current mode logic" in "1983 IEEE Microwave and Millimeter wave monolithic Circuits Symposium", Boston, 31 May-1 June 1983, pages 12 to 16. This article describes a digital high-speed circuit of GaAs used for high-frequency applications. This circuit is obtained from an elementary logic gate according to the CML technology (CML is short for Current Mode Logic) shown in FIG. 2 of the aforementioned document. This logic gate is constituted by a differential amplifier and by two paired so-called buffer stages. The differential amplifier comprises two charge depletion field effect transistors normally connected in the forward direction and designated as DRIVER transistors, one of which is controlled by the input voltage (INPUT), while the other is controlled by a reference signal (REF). The coupled sources of these two transistors are connected to the drain of an enhancement field effect transistor which is normally pinched, whose gate and source, which are shortcircuited, are connected to the supply voltage $V_{SS}$ ($-5$ V), in a manner such that this transistor operates as a current source. The drains of the DRIVER transistors are connected to the supply voltage $V_{DD}=0$ V (ground) through two load resistors $R_L$. The voltage of these drains will control the respective gates of the enhancement field effect transistors of the BUFFER stages. The latter transistors are connected in common drain arrangement to the voltage $V_{DD}=0$ and their source is connected to two series-connected diodes which are connected to a transistor constituting a current source analogous to that of the differential stage. The output signals of the logic gate are formed at the drains of the current source transistors of the BUFFERS in the form of an input signal amplified by one of these transistors and of its complementary signal for the other transistor.

This circuit operates by means of a single supply voltage $V_{SS}=-5$ V, because the second supply voltage $V_{DD}=0$ is ground and the third voltage REF is an internal reference. The supplementary supply voltage, which was designated by $V_B$ and which controlled the current source transistors in the description of the ECL cell according to the French Patent specification Publication No. 2407612, does not exist in the present circuit due to the fact that the gate of each of the three current source transistors is shortcircuited with the source and is brought to the potential $V_{SS}=-5$ V.

Moreover, this circuit is completely compatible with the ECL logic circuit obtained on silicon.

However, the fact that this circuit utilizes for controlling the second transistor of the differential stage a reference signal REF involves certain drawbacks. The first drawback resides in the fact that this signal has to be formed on the same substrate as the circuit in the proximity of the latter, which reduces the integration density and increases the consumption of the circuit. However, the most important disadvantage is that the use of such a signal as a reference considerably reduces the dynamic range of the response of the elementary logic circuit. Other disadvantages not to be neglected reside in the use of charge depletion transistors in the level translater stages and in the realization of three current sources for the single elementary gate as well as in the use of two diodes per translator stage, which considerably increases the consumption of such a circuit.

SUMMARY OF THE INVENTION

Therefore, the invention provides a considerable improvement above realization of an elementary circuit such as defined in the which is characterized in that the transistors $T_3$ and $T_4$ of the level translator stages are of the enhancement type, in that the cathodes of the diodes $D_3$ and $D_4$ of the level translator stages are connected to the second supply voltage terminal ($V_{SS}$) through the paired resistors $R_3$ and $R_4$, in that the output signal S, which is the inverse value of the input signal E of this elementary logic circuit, is available at the cathode of the diode $D_4$ of the first level translator stage, in that the output signal $\bar{S}$ complementary to the preceding signal is available at the cathode of the diode $D_3$ of the second level translater stage, and in that finally the output signal S of this elementary logic circuit constitutes the reference signal, which controls the transistor $T_2$ of the second branch of the differential amplifier.

A circuit based on such an elementary circuit can also be obtained, which is characterized in that a transistor $T_0$ controlled by a signal $E_0$ is arranged parallel to the transistor $T_1$ in the first branch of the differential amplifier, and in that the output signal S of this logic circuit available at the cathode of the diode $D_4$ of the first level translater stage is the result of the logic NOR operation between the input signals $E_0$ and $E_1$.

Under these conditions, the elementary circuit as well as the other circuits obtained on the basis of the latter are perfectly compatible with the ECL logic, the supply voltages being identical and the input and output levels being the same.

In comparison with the prior art, the power consumption is considerably reduced, the transfer function is improved and the hysteresis as well as the propagation time are reduced. Moreover, the elimination of the necessity of producing the internal reference voltage and of manufacturing four active elements per cell provides with respect to the integration density and the simplicity of manufacturing the integrated circuit a certain advantage.

BRIEF DESCRIPTION OF THE DRAWING

In order that the invention may be readily carried out, it will now be described more fully with reference to the accompanying drawings, in which.

DESCRIPTION OF THE PREFERRED EMBODIMENTS

The elementary logic circuit according to the invention is constituted by diodes and field effect transistors of the Schottky type monolithically integrated with resistors on a substrate of gallium arsenide.

It can be used to form IC modules compatible with the ECL 100 K logic realized on silicon. It consequently accepts the same supply voltages:

$V_{DD}=0$, mass and $V_{SS}=-4.5$ V.

It moreover receives an input signal E, whose levels 0 and 1 are of the order of $-0.9$ V and $-1.7$ V, respectively, identical to those constituting the input signals of a ECL circuit.

Figure 1:
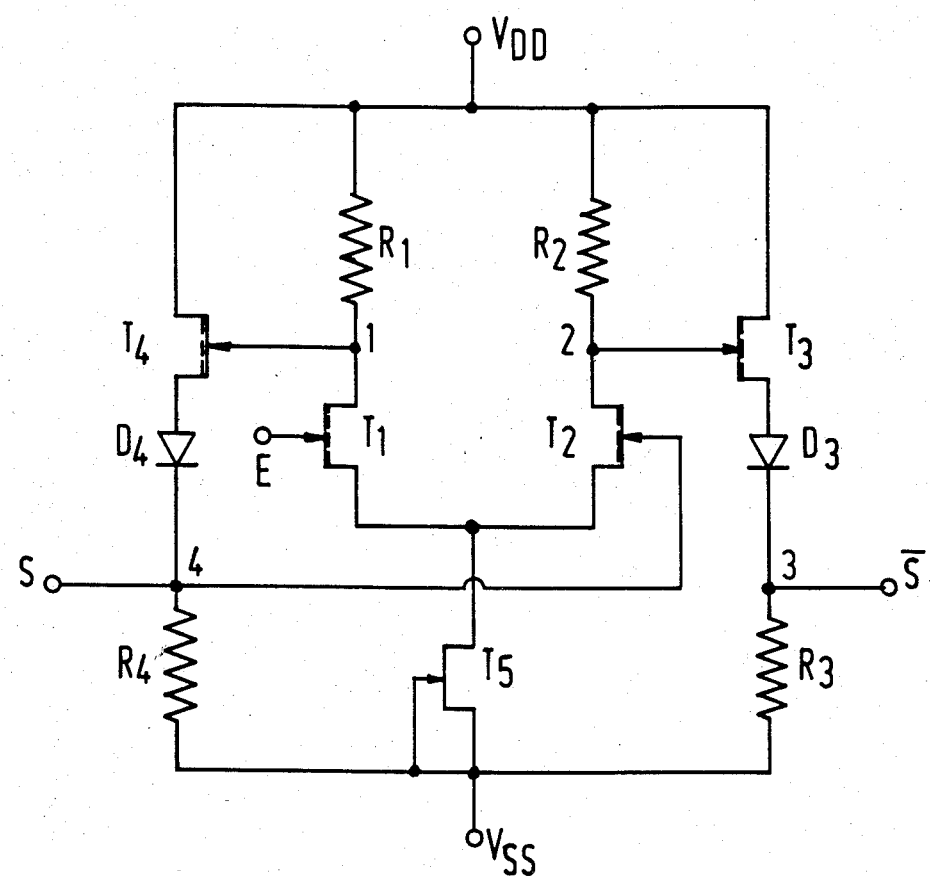
FIG. 1 shows the elementary circuit having one input and two complementary outputs acting as a simple inverter.

As shown in FIG. 1, the elementary circuit acts as a simple inverter, but it supplies two complementary output signals. Consequently, there are available at the output on the one hand the signal $S=\bar{E}$ and on the other hand the signal $\bar{S}=E$.

This elementary circuit first comprises a differential amplifier, whose first branch is constituted by the transistor $T_1$ of the enhancement type and whose second branch is constituted by the transistor $T_2$ paired with the first-mentioned transistor. The drains of the transistors $T_1$ and $T_2$ are polarized by the supply voltage $V_{DD}=0$ through the load resistors $R_1$ and $R_2$, respectively, which are paired. The sources of the transistors $T_1$ and $T_2$ are coupled to each other and are connected to the drain of the charge depletion transistor $T_5$. The latter, whose shortcircuited gate and source are brought to the supply potential $V_{SS}= -4.5$ V, acts as a current source.

The transistor $T_1$ is controlled by the input signal E. The first branch of the differential amplifier supplies at the drain of the transistor $T_1$ signal $S_1$, while the second branch supplies at the drain of the transistor $T_2$ a signal $S_2$.

This elementary circuit moreover comprises two level translator stages. The first of these stages is constituted by an enhancement transistor $T_4$, whose drain is brought to the supply potential $V_{DD}$ and whose source is connected to the anode of a diode $D_4$. This transistor $T_4$ is controlled by the output signal $S_1$ of the first branch of the differential amplifier and acts as a follower. The level translation just mentioned is ensured by the Schottky diode $D_4$. The cathode of this diode is polarized by the supply voltage $V_{SS}$ through a resistor $R_4$.

The output signal of the elementary circuit $S=\overline{E}$ is available at the source of the transistor $T_4$.

The most important characteristic feature of the invention is that this signal S will control the transistor $T_2$ of the second branch of the differential amplifier and replaces the reference voltage for the operation of this differential stage.

The second level translator stage is composed of the transistor $T_3$, of the diode $D_3$ and of the resistor $R_3$ on the one hand paired with the transistor $T_4$, the diode $D_4$ and the resistor $R_4$ of the first stage on the other hand connected in the same manner.

In these conditions, the output signal $\overline{S}=E$ is available at the source of the transistor $T_3$.

Figure 2:
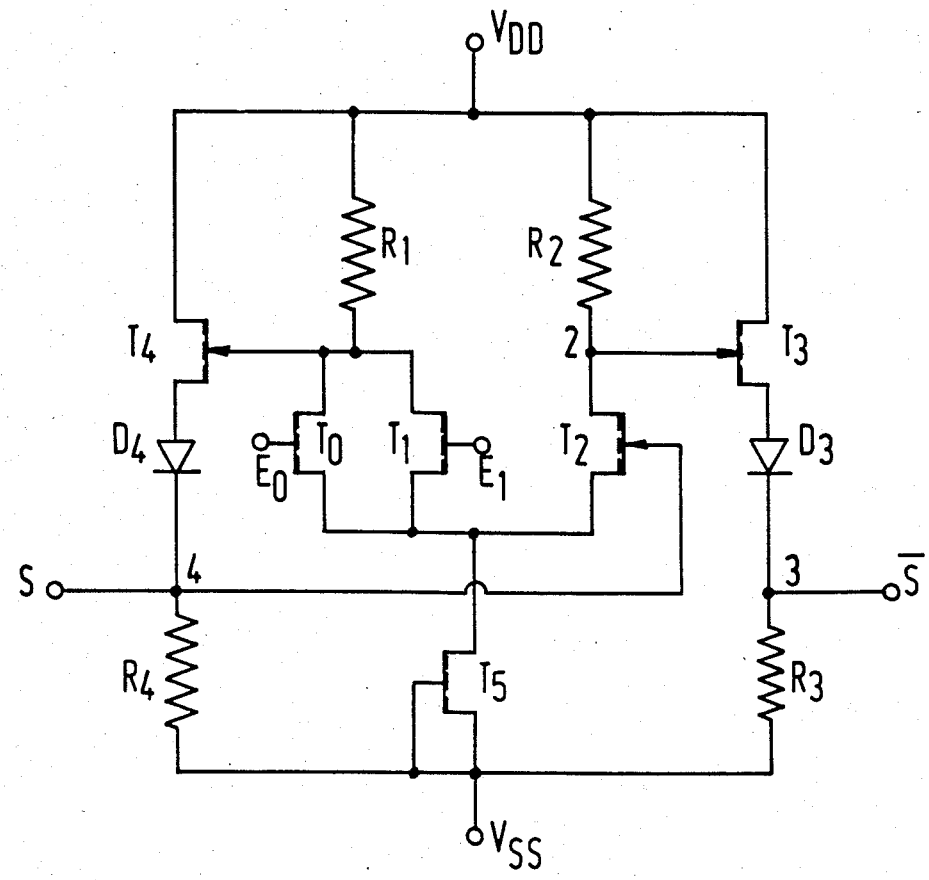
FIG. 2 shows the elementary circuit having two inputs and two complementary outputs acting as a NOR/OR logic.

As shown in FIG. 2, the circuit according to the invention can have the NOR/OR function. Thus, the transistor $T_1$ controlled by the input signal E, as shown in FIG. 1, is replaced by two identical transistors $T_0$ and $T_1$ controlled by the input signals $E_0$ and $E_1$, respectively, at which the logic operation is effected so that the output signals of this novel elementary circuit are:

$S=\overline{E_0+E_1}$, and
$S=E_0+E_1$.

The characteristics of the active and passive elements, which permit obtaining this circuit according to the self-aligned technology on gallium arsenide, are the following:

| Transistors | $T_1, T_2$ enhancement transistors | $T_3, T_4$ enhancement transistors | $T_5$ depletion transistors | $D_3, D_4$ diode |
|---|---|---|---|---|
| Gate length | 0.9 μm | 0.9 μm | | |
| Gate width | 20 μm | 160 μm | 4.5 μm | 10 μm |
| Pinch voltage | 0 V | 0 V | −1.5 V | |
| Linear Resistors | $R_1, R_2$ 1.9 kΩ | $R_3, R_4$ 10 kΩ | | |

In these conditions, this elementary circuit has numerous advantages.

Firstly, the input levels are not degraded when the fan-in of the circuit 2, which is the case when the circuit has the NOR function.

Secondly, these levels are not degraded when the fan-out varies from 1 to 4.

Figure 3:
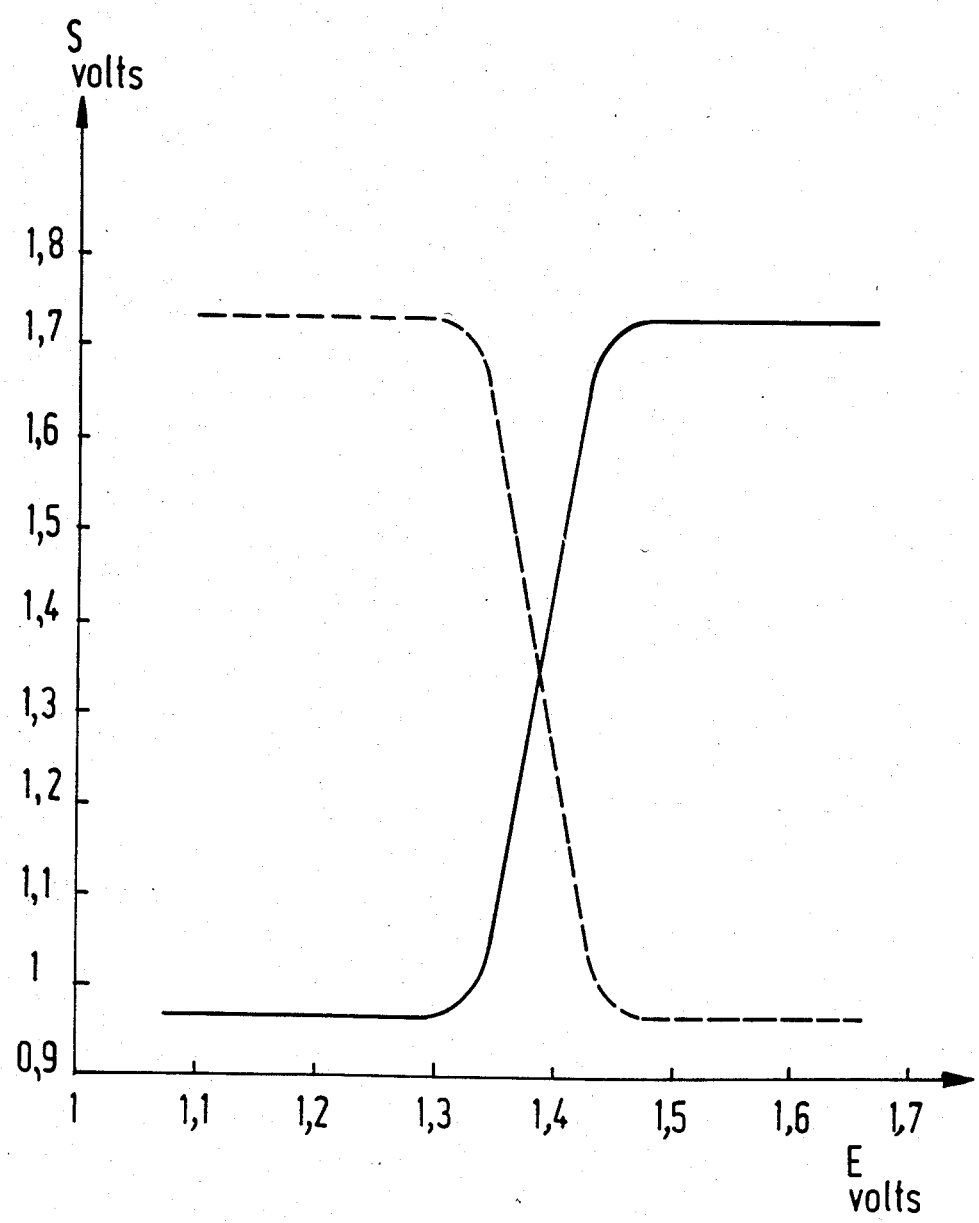
FIG. 3 shows the transfer curve of the elementary logic circuit acting as a simple inverter.

Thirdly, the gain G of this circuit defined as the slope of the transfer curve shown in FIG. 3, i.e. $G=\Delta V_S/\Delta V_E$, becomes equivalent to 30, while the same gain never exceeded the value 5 in the case of the ECL 100 K technology. It is found in fact that, when considering this curve, the passage from the low level to the high level is effected when the input voltage passes from 1.3 to 1.440 V, which involves a very abrupt transition.

Fourthly, the hysteresis is negligible, of the order of ten nM, while the deviation of the logic cycle is 0.8 V, the deviation being equal to the difference between the high level at −1.7 V and the low level at −0.9 V. It should be noted that this behavior is not obtained in the case of ECL. In the circuit according to the invention, the value of each of the components is made an optimum in order to reduce the hysteresis, while maintaining the required logic levels. The results are illustrated by the curves shown in FIG. 3, these curves showing the absolute symmetry of the transfer function corresponding to this circuit.

Fifthly, the use of the resistors $R_3$ and $R_4$ for polarizing the diodes $D_3$ and $D_4$ permits considerably reducing the consumption of the circuit with respect to the circuit obtained according to ECL on the one hand, but also with respect to the circuit described in the Japanese Publication mentioned as prior art on the other hand. According to ECL, the power consumption was of the order of 25 mW. It is here $P \simeq 4.7$ mW for a fan-out equal to 1.

Sixthly, the suppression of the internal reference voltage, which will control the transistor of the second branch of the differential amplifier, and its replacement by a positive counteraction by means of the output signal, permits on the one hand increasing the integration density and on the other hand considerably reducing the propagation time both with respect to the ECL circuit and with respect to the circuit mentioned as prior art. This propagation time was of the order of 400 ps according to ECL, while in this case it is:

for a fan-out 1: tpd ≃ 135 ps
for a fan-out 4: tpd ≃ 170 ps.

It should be noted that the transistor $T_5$ ensures the stability of the output levels as a function of the variations of the input voltage on both sides of the threshold.

It is clear that numerous variations to the invention are possible, more particularly with respect to the choice of the semi-insulating substrate and to the dimensions and the choice of the technology for obtaining the active and passive elements without departing from the scope of the invention, such as defined by the appended claims.

What is claimed is:

1. An elementary logic circuit having Schottky barrier field effect transistors of gallium arsenide and comprising a differential amplifier, a load register $R_1$ and a transistor $T_1$, a first branch of said amplifier being formed by the transistor $T_1$, which is of the enhancement type, controlled by an input signal E and connected by its drain, at which a signal $S_1$ is available, to a first supply voltage terminal ($V_{DD}$) through the load resistor $R_1$, a load resistor $R_2$ and an enhancement type transistor $T_2$, a second branch of said amplifier being formed by the enhancement transistor $T_2$ controlled by a reference signal and connected by its drain, at which a signal $S_2$ is available, to the first supply source terminal ($V_{DD}$) through the load resistor $R_2$, a transistor $T_5$, the coupled sources of the transistors $T_1$ and $T_2$ being supplied with current through the transistor $T_5$ of the charge depletion type connected in a common gate-source arrangement to a second supply potential terminal ($V_{SS}$), said circuit further comprising two paired level translator stages, the first of which comprises a diode $D_4$ and a transistor $T_4$ connected in a common drain arrangement to the first supply voltage terminal ($V_{DD}$), controlled by the signal $S_1$ of the first branch of the differential amplifier and connected by its source to the anode of the diode $D_4$, and the second of which comprises a diode $D_3$, and transistor $T_3$ connected in a common drain arrangement to the first voltage supply terminal ($V_{DD}$), controlled by the signal $S_2$ of the second branch of the differential amplifier and connected by its source to the anode of the diode $D_3$, the transistors $T_3$ and $T_4$ of the level translator stages being of the enhancement type, further comprising resistors $R_3$ and $R_4$, the cathodes of the diodes $D_3$ and $D_4$ of the level translator stages being connected to the second supply voltage terminal ($V_{SS}$) through the resistors $R_3$ and $R_4$, which are paired, the output signal S, which is the inverse value of the input signal E of the elementary logic circuit, being provided at the cathode of the diode $D_4$ of the first level translator stage, the output signal $\bar{S}$, complementary to the output signal S, being provided at the cathode of the diode $D_3$ of the second level translator stage, and the output signal S of the elementary logic circuit comprising a reference signal which controls the transistor $T_2$ of the second branch of the differential amplifier.

2. A circuit as claimed in claim 1, characterized in that a transistor $T_0$ controlled by a signal $E_0$ is connected in parallel with the transistor $T_1$ in the first branch of the differential amplifier, and in that the output signal S of this logic circuit available at the cathode of a diode $D_4$ of the first level translater stage is the result of the logic NOR operation between the input signals $E_0$ and $E_1$.

* * * * *

UNITED STATES PATENT AND TRADEMARK OFFICE
CERTIFICATE OF CORRECTION

PATENT NO. : 4,661,725
DATED : April 28, 1987
INVENTOR(S) : Bernard Chantepie

It is certified that error appears in the above-identified patent and that said Letters Patent is hereby corrected as shown below:

IN THE CLAIMS

Claim 2, line 6     change "a" to --the-- line 7     change "the" to --a--

Signed and Sealed this

Fourteenth Day of November, 1989

Attest:

JEFFREY M. SAMUELS

*Attesting Officer*     *Acting Commissioner of Patents and Trademarks*